(12) United States Patent
Manssen et al.

(10) Patent No.: US 7,917,104 B2
(45) Date of Patent: Mar. 29, 2011

(54) TECHNIQUES FOR IMPROVED ADAPTIVE IMPEDANCE MATCHING

(75) Inventors: Keith R. Manssen, Bull Valley, IL (US); Matthew R. Greene, Crystal Lake, IL (US); Wayne E. Smith, Crystal Lake, IL (US); Guillaume Blin, Malden, MA (US)

(73) Assignee: Paratek Microwave, Inc., Nashua, NH (US)

( * ) Notice: Subject to any disclaimer, the term of this patent is extended or adjusted under 35 U.S.C. 154(b) by 366 days.

(21) Appl. No.: 11/789,015

(22) Filed: Apr. 23, 2007

(65) Prior Publication Data

US 2008/0261544 A1    Oct. 23, 2008

(51) Int. Cl.
*H04B 1/04* (2006.01)
*H01Q 11/12* (2006.01)

(52) U.S. Cl. ............ 455/121; 455/125; 455/115.1; 455/193.2

(58) Field of Classification Search ........... 455/67.11, 455/115.1, 115.4, 120, 121, 125, 126, 193.1–193.3
See application file for complete search history.

(56) References Cited

U.S. PATENT DOCUMENTS

| | | |
|---|---|---|
| 2,745,067 A | 5/1956 | True |
| 3,117,279 A | 1/1964 | Ludvigson |
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebeing |
| 4,201,960 A | 5/1980 | Skutta |
| 4,227,256 A | 10/1980 | O'Keefe |
| 4,493,112 A | 1/1985 | Bruene |
| 4,799,066 A * | 1/1989 | Deacon .................. 343/861 |
| 5,142,255 A | 8/1992 | Chang |

(Continued)

FOREIGN PATENT DOCUMENTS

JP    03-276901    9/1991

(Continued)

OTHER PUBLICATIONS

International Search Report Dated Jul. 2, 2008.

(Continued)

*Primary Examiner* — Duc M Nguyen
(74) *Attorney, Agent, or Firm* — Ed Guntin; Guntin Meles & Gust, PLC (57) ABSTRACT

An embodiment of the present invention provides an apparatus, comprising an RF matching network connected to at least one RF input port and at least one RF output port and including one or more voltage or current controlled variable reactive elements; and wherein the RF matching network is tuned to optimize the RF matching network and wherein said tuning is limited by a predetermined number of tuning steps that are taken within a transmit burst and/or limited by the magnitude of each step taken within a transmit burst and/or limited to the steps only being allowed between bursts.

25 Claims, 5 Drawing Sheets

U.S. PATENT DOCUMENTS

| | | | | |
|---|---|---|---|---|
| 5,195,045 | A | 3/1993 | Keane | |
| 5,200,826 | A | 4/1993 | Seong | |
| 5,258,728 | A * | 11/1993 | Taniyoshi et al. | 333/132 |
| 5,301,358 | A * | 4/1994 | Gaskill et al. | 455/193.2 |
| 5,371,473 | A * | 12/1994 | Trinh et al. | 330/129 |
| 5,446,447 | A * | 8/1995 | Carney et al. | 340/572.4 |
| 5,451,914 | A | 9/1995 | Stengel | |
| 5,457,394 | A | 10/1995 | McEwan | |
| 5,502,372 | A | 3/1996 | Quan | |
| 5,524,281 | A | 6/1996 | Bradley | |
| 5,564,086 | A | 10/1996 | Cygan | |
| 5,778,308 | A | 7/1998 | Sroka et al. | |
| 5,874,926 | A | 2/1999 | Tsuru | |
| 5,880,635 | A * | 3/1999 | Satoh | 330/144 |
| 5,969,582 | A * | 10/1999 | Boesch et al. | 333/129 |
| 6,009,124 | A * | 12/1999 | Smith et al. | 375/267 |
| 6,045,932 | A | 4/2000 | Jia | |
| 6,061,025 | A | 5/2000 | Jackson | |
| 6,100,733 | A | 8/2000 | Dortu | |
| 6,101,102 | A | 8/2000 | Brand | |
| 6,133,883 | A | 10/2000 | Munson | |
| 6,414,562 | B1 | 7/2002 | Bouisse | |
| 6,466,774 | B1 * | 10/2002 | Okabe et al. | 455/150.1 |
| 6,531,936 | B1 | 3/2003 | Chiu | |
| 6,535,722 | B1 | 3/2003 | Rosen | |
| 6,570,462 | B2 | 5/2003 | Edmonson | |
| 6,590,468 | B2 | 7/2003 | du Toit | |
| 6,590,541 | B1 | 7/2003 | Schultze | |
| 6,657,595 | B1 | 12/2003 | Phillips et al. | |
| 6,710,651 | B2 | 3/2004 | Forrester | |
| 6,759,918 | B2 | 7/2004 | du Toit | |
| 6,765,540 | B2 | 7/2004 | Toncich | |
| 6,774,077 | B2 | 8/2004 | Sengupta | |
| 6,795,712 | B1 | 9/2004 | Vakilian | |
| 6,825,818 | B2 | 11/2004 | Toncich | |
| 6,845,126 | B2 | 1/2005 | Dent et al. | |
| 6,859,104 | B2 | 2/2005 | Toncich | |
| 6,862,432 | B1 * | 3/2005 | Kim | 455/80 |
| 6,864,757 | B2 | 3/2005 | du Toit | |
| 6,868,260 | B2 * | 3/2005 | Jagielski et al. | 455/107 |
| 6,905,989 | B2 | 6/2005 | Ellis | |
| 6,920,315 | B1 | 7/2005 | Wilcox et al. | |
| 6,946,847 | B2 | 9/2005 | Nishimori | |
| 6,961,368 | B2 | 11/2005 | Dent et al. | |
| 6,993,297 | B2 * | 1/2006 | Smith, Jr. | 455/82 |
| 7,009,455 | B2 | 3/2006 | Toncich | |
| 7,071,776 | B2 | 7/2006 | Forrester | |
| 7,113,614 | B2 | 9/2006 | Rhoads | |
| 7,151,411 | B2 | 12/2006 | Martin | |
| 7,176,845 | B2 | 2/2007 | Fabrega-Sanchez | |
| 7,180,467 | B2 | 2/2007 | Fabrega-Sanchez | |
| 7,221,327 | B2 | 5/2007 | Toncich | |
| 7,339,527 | B2 | 3/2008 | Sager | |
| 7,426,373 | B2 * | 9/2008 | Clingman et al. | 455/121 |
| 7,535,312 | B2 | 5/2009 | McKinzie | |
| 2002/0191703 | A1 | 12/2002 | Ling | |
| 2002/0193088 | A1 * | 12/2002 | Jung | 455/191.2 |
| 2003/0114124 | A1 | 6/2003 | Higuchi | 455/126 |
| 2003/0193997 | A1 * | 10/2003 | Dent et al. | 375/219 |
| 2003/0232607 | A1 | 12/2003 | Le Bars et al. | |
| 2004/0009754 | A1 | 1/2004 | Smith | |
| 2004/0137950 | A1 | 7/2004 | Bolin | |
| 2004/0202399 | A1 | 10/2004 | Kochergin | |
| 2004/0257293 | A1 | 12/2004 | Friedrich | |
| 2005/0032488 | A1 * | 2/2005 | Pehlke et al. | 455/127.1 |
| 2005/0042994 | A1 * | 2/2005 | Otaka et al. | 455/180.3 |
| 2005/0093624 | A1 | 5/2005 | Forrester | |
| 2005/0215204 | A1 | 9/2005 | Wallace | |
| 2005/0282503 | A1 | 12/2005 | Onno | |
| 2006/0160501 | A1 | 7/2006 | Mendolia | |
| 2006/0183442 | A1 | 8/2006 | Chang | |
| 2006/0281423 | A1 * | 12/2006 | Caimi et al. | 455/129 |
| 2007/0013483 | A1 | 1/2007 | Stewart | |
| 2007/0042734 | A1 | 2/2007 | Ryu | |
| 2007/0080888 | A1 | 4/2007 | Mohamadi | |
| 2007/0197180 | A1 | 8/2007 | McKinzie | |
| 2008/0055016 | A1 | 3/2008 | Morris | |
| 2008/0158076 | A1 | 7/2008 | Walley | |

FOREIGN PATENT DOCUMENTS

JP   10209722   8/1998

OTHER PUBLICATIONS

U.S. Appl. No. 12/454,148, filed May 13, 2009, McKinzie.

* cited by examiner

TECHNIQUES FOR IMPROVED ADAPTIVE IMPEDANCE MATCHING

One function of an adaptive impedance matching module may be to tune the network to optimize an RF matching network. Optimization may include, but is not limited to maximizing power added efficiency (PAE), minimizing distortion and/or maximizing output power, among other things.

One of the important engineering specifications of an impedance matching control system is the dynamic range of input power over which it will operate. Additional engineering concerns prevalent with impedance matching may include the need for increased performance of the network and/or to enable it to perform in systems that might otherwise make it difficult for the system to make all the required system specifications. Although not limited in this respect, GSM, EDGE and WCDMA systems have specifications limiting the allowable phase shifts within a transmit burst. Additionally, all cellular handsets have SAR (specific absorption rate) limits dictating how much RF energy may be absorbed by human bodies in close proximity. There are soon to be specifications that will dictate TRP (total radiated power) to be transmitted by cellular handsets, and handset suppliers will need to meet these specifications within a small number of transmit bursts (in a TDMA system) or in a very short period of time (in a continuous transmission system). Thus, a strong need exists for techniques for improved adaptive impedance matching.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g. as in a cause an effect relationship).

An embodiment of the present invention provides closed-loop control of an adaptive impedance matching module (AIMM). The RF output node voltage of the AIMM tuner circuit may be monitored and maximized to insure the best available impedance match to arbitrary load impedance. In addition, improvement in dynamic range may be achieved by adaptively changing the RF coupling level between the voltage sensed at the output port (antenna side) of the matching network and the voltage provided to the detector. This coupling level may be controlled by a processor which also does the closed loop tuning. Another means of realizing variable coupling levels is to digitally switch between different tap points in a series string of variable capacitors which form a shunt voltage tunable dielectric capacitor at the output node of the AIMM tuner.

Figure 1:
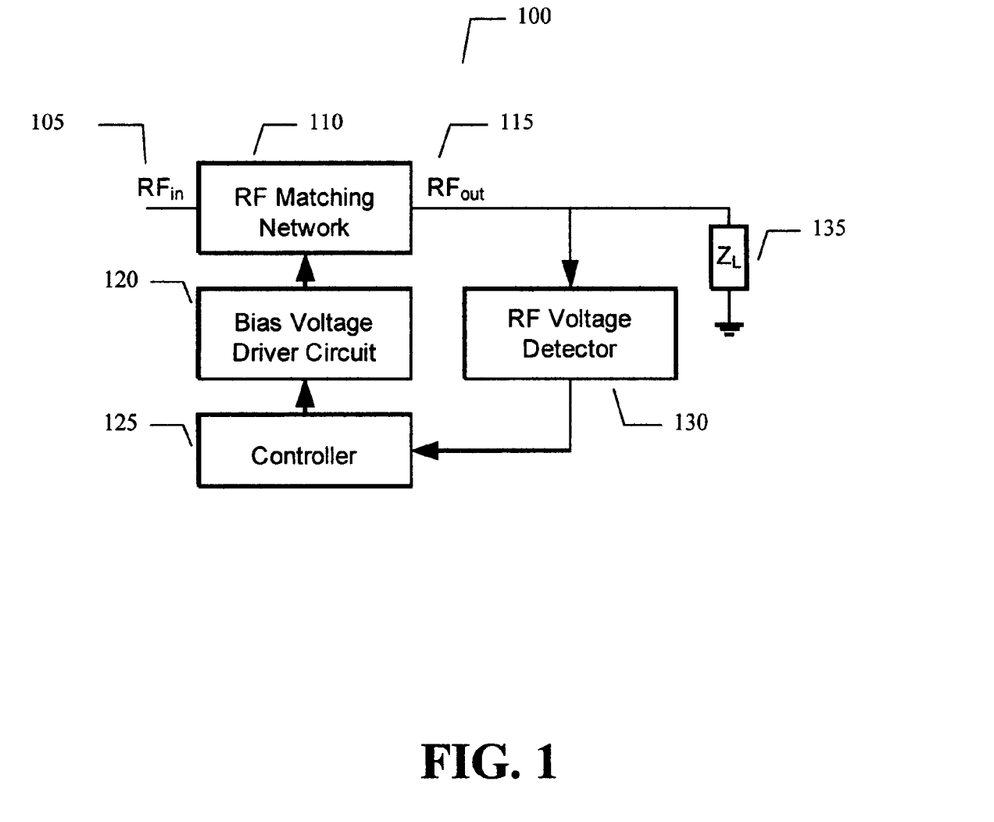
FIG. 1 illustrates a block diagram of an adaptive impedance matching module AIMM control system of one embodiment of the present invention.

A typical function of an adaptive impedance matching module (AIMM) is to adaptively maximize the RF power transfer from its input port to an arbitrary load impedance $Z_L$ where the load changes as a function of time. Turning now to the figures, FIG. 1, shown generally as 100, is an AIMM block diagram.

The RF matching network 110 may contain inductors and capacitors required to transform the arbitrary load impedance $Z_L$ 135 to an impedance equal to or close to a defined system impedance, such as 50 ohms. The net benefit of this transformation is an improvement in the level of power transferred to the load $Z_L$ 135, and a reduction in the level of reflected power from the RF input port 105. This second benefit is also known as an improvement in the input mismatch loss.

The RF matching network 110 may contain one or more variable reactive elements which are voltage controlled. The variable reactive elements may be, although are not required to be, variable capacitances, variable inductances, or both. In general, the variable capacitors may be semiconductor varactors, MEMS varactors, MEMS switched capacitors, ferroelectric capacitors, or any other technology that implements a variable capacitance. The variable inductors may be switched inductors using various types of RF switches including MEMS-based switches. The reactive elements may be current controlled rather than voltage controlled without departing from the spirit and scope of the present invention.

In an embodiment of the present invention, the variable capacitors of the RF matching network may be tunable integrated circuits, such as voltage variable capacitors (e.g., voltage tunable dielectric capacitors or Parascan® Tunable Capacitors (PTCs)). Each tunable capacitor may be realized as a series network of capacitors which are all tuned using a common tuning voltage.

The RF voltage detector 130 may be comprised of a diode detector, a temperature compensated diode detector, a logarithmic amplifier, or any other means to detect an RF voltage magnitude. The phase of the RF voltage is not required. The controller 125 accepts as an input the information associated with the detected RF output 115 voltage. The controller 125 provides one or more outputs that control the bias voltage driver circuits. The controller 125 may be digitally-based such as a microprocessor, a digital signal processor, or an ASIC, or any other digital state machine. The controller may also be an analog-based system.

The bias voltage driver circuit 120 is a means of mapping control signals that are output from the controller 125 to a voltage range that is compatible with the tunable reactive elements in the RF matching network 110. The driver circuit may be an application specific integrated circuit (ASIC) whose function is to accept digital signals from the controller 125 and then output one or more analog voltages for one or more tunable reactive elements in the RF matching circuit 110. The driver circuit 120 may provide a wider range of analog tuning voltages than what is used as a power supply voltage by the controller 125. Hence the driver circuit 120 may perform the functions of voltage translation and voltage scaling.

The purpose of the control system shown in FIG. 1 is to monitor the output RF voltage magnitude and to use this information as an input to an algorithm that adjusts the tuning voltages provided to the tunable reactive elements in the RF matching network 110. The algorithm adjusts the reactances to optimize an RF output 115 voltage. Various options exist for control algorithms. In general, the algorithm may be a scalar multi-dimensional maximization algorithm where the independent variables are the tuning voltages for the reactive elements. Some embodiments of the operation of the tuning algorithm of the present invention, may increase performance of a network and/or enable it to perform in systems that might otherwise make it difficult for the system to make all the required system specifications. GSM, EDGE and WCDMA systems have specification limiting the allowable phase shifts within a transmit burst. Additionally, all cellular handsets have SAR (specific absorption rate) limits dictating how much RF energy may be absorbed by human bodies in close proximity. There are soon to be specifications that will dictate TRP (total radiated power) to be transmitted by cellular handsets, and handset suppliers will need to meet these specifications within a small number of transmit bursts (in a TDMA system) or in a very short period of time (in a continuous transmission system).

In an embodiment of the present invention, in order to achieve the above objectives, the AIMM tuning algorithm may include:

1—Limit the number of tuning "steps" that are taken within a transmit burst or limit the magnitude of each step taken within a transmit burst, or limit the steps to only be allowed between bursts (when the transmitter is disabled). This can be accomplished by putting time delays in the algorithm, or to only allow tuning only when the transmitter is inactive.

2—Limit the allowed tuning to avoid certain matching impedances, or put the tuner in a "default" position when the cellular handset transmitter is at the full power step. By doing so at the highest power level, the present invention may avoid having the handset antenna couple higher power into the human tissue near the phone's antenna. It is at predetermined power levels based upon usage, user and handset characteristics that the SAR limit typically becomes a factor, and by limiting the effectiveness of the AIMM tuner at these predetermined power levels based upon various handsets with various uses and in various usages scenarios, the present invention can avoid the possibility of causing the handset to exceed the SAR limits.

Embodiments of the present invention may be incorporated into various particular handsets. As handsets and use parameters vary, SAR characteristics will vary and therefore usage parameters may be developed. These usage parameters may be used to determine what power stops could exceed the SAR standards and therefore which algorithms of the present invention may be used most appropriately. Then at those power steps one can implement a default limit. Therefore, an embodiment of the present invention will not let the apparatus go past this amount of tuning. Through characterization a handset manufacture may determine handset characteristics to enable the best use and settings for the present invention to ensure the SAR limit is not exceeded. Thus, by characterizing specific phones with specific use and user scenarios, it is possible to set the present invention to match that particular instantiation.

Figure 6:
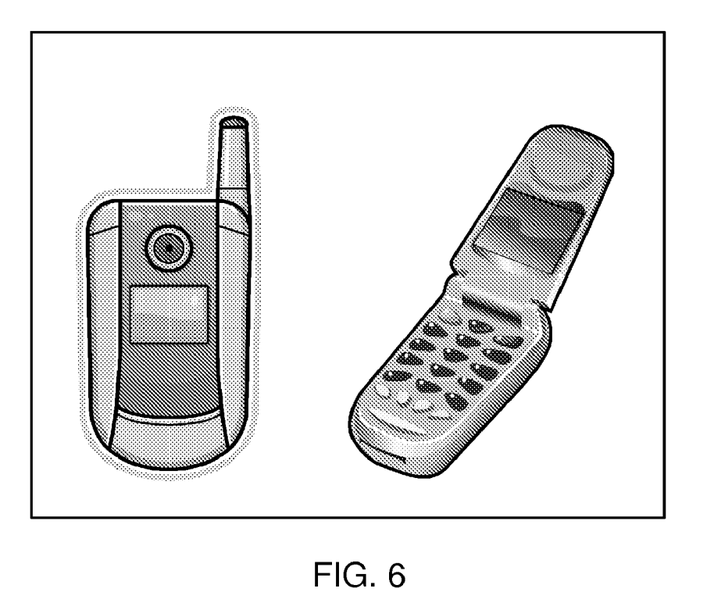
FIG. 6 shows an embodiment of a flip phone.

3—In order to allow the adaptive impedance matching module (AIMM) tuner to achieve the optimal match as quickly as possible, a memory system could be engaged in which the optimal match is stored for each frequency band, or perhaps even for each group of channels, and this memorized optimal match is used as the starting position any time the phone is directed to that particular band or channel. This memory could also remember operating positions of the aforementioned phone such as flip-open or flip-closed of an illustrative flip phone shown in FIG. 6 in order to better predict the best starting position for the matching network.

Figure 2:
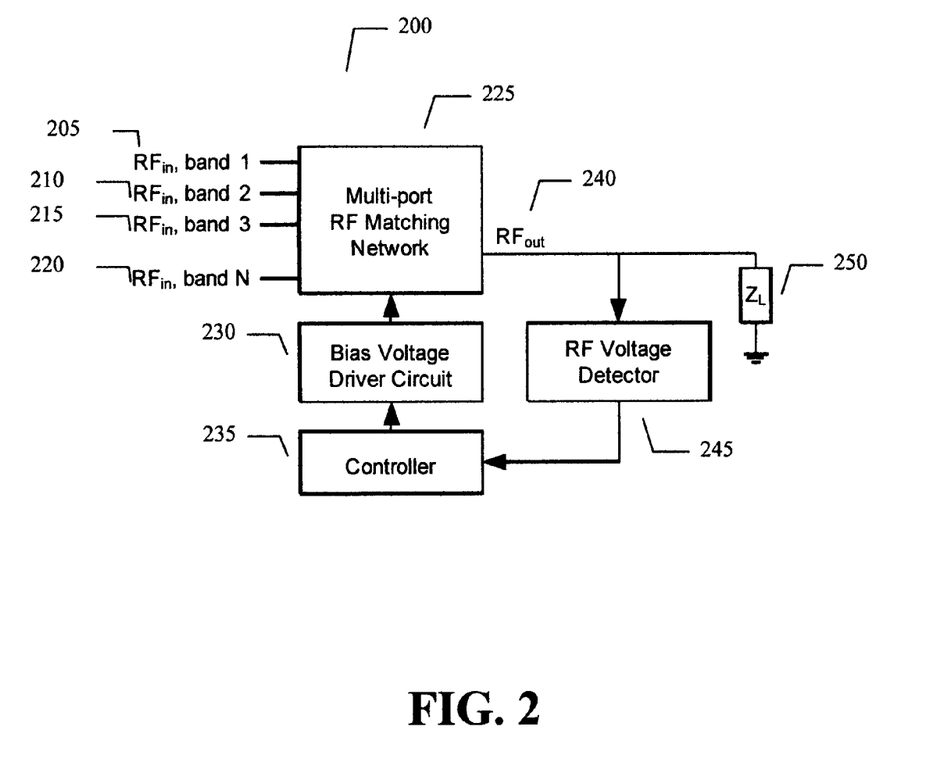
FIG. 2 illustrates a control system for a multi-port adaptive impedance matching module of one embodiment of the present invention.

A simplified control system that the present invention may be utilized in is shown in FIG. 1 and is illustrated using a 2 port RF matching network. However, this control system is extensible to multi-port RF matching networks as shown in FIG. 2, generally as 200. Consider a RF multiplexing filter with N input ports where each port is designed for a specific band of frequencies. Assume that N transmitters drive the N input ports 205, 210, 215 and 220, and that each input port is coupled to the single RF output port 240 using RF circuits that contain variable reactive elements. The objective of the control system remains the same, to optimize an RF matching network for RF transmissions, and thus to optimize the power transfer from the nth input port to the arbitrary load impedance. Further, the RF voltage detector 245, controller 235 and bias voltage driver circuit 230 functions as described above with reference to FIG. 1 and in the embodiment of FIG. 2, the RF matching networks is a multi-port RF matching network 225.

Although the present invention is not limited in this respect, the arbitrary load impedance $Z_L$ 250 may be a multi-band antenna in a mobile wireless device and the multi-port matching network 225 may be a diplexer whose function is to route the signal between two or more paths by virtue of the signal frequency and under the control of the handset logic, hand controller or processor.

Figure 3:
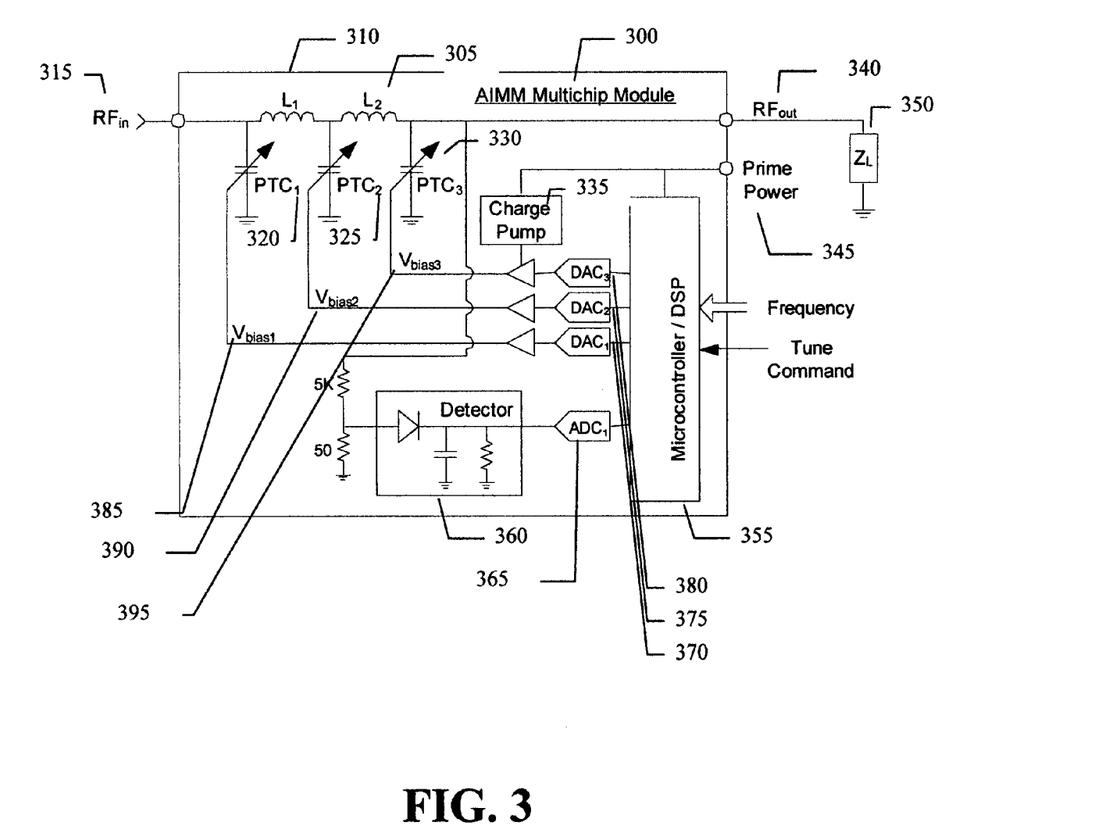
FIG. 3 shows an implementation of an AIMM closed loop control system of one embodiment of the present invention.

Looking now at FIG. 3, the variable capacitors (such as, but not limited to, PTCs) 320, 325 and 330 and inductors 305 and 310 may be built into a multichip module 300 containing a detector 360, an ADC 365, a processor 355, DACs 370, voltage buffers, and charge pump 335. This multichip module 300 may be designed with a closed loop feedback system to maximize the RF voltage across the output node by adjusting all the PTC 320, 325 and 330 bias voltages, and doing so independently.

In an embodiment of the present invention as provided in FIG. 3, the RF matching network may be comprised of inductors $L_1$ 310, $L_2$ 305 and variable capacitors $PTC_1$ 320, $PTC_2$ 325 and $PTC_3$ 330. Note that each variable capacitor may itself be a complex network. The RF voltage detector 360 in this AIMM may be comprised of a resistive voltage divider (5 KΩ/50Ω) and the simple diode detector. In an embodiment of the present invention, the controller may be comprised of the analog-to-digital converter or $ADC_1$ 355, the microprocessor 355, plus the digital-to-analog converters $DAC_1$ 310, $DAC_2$ 375 and $DAC_3$ 380. The controller may use external signals such as knowledge of frequency, Tx or Rx mode, or other available signals in the operation of its control algorithm. The bias voltage driver circuit may be comprised of a DC-to-DC converter such as the charge pump 335, in addition to the three analog buffers whose output voltage is labeled $V_{bias1}$, 385, $V_{bias}$ 390, and $V_{bias3}$ 395. The DC-to-DC voltage converter may be needed to supply a higher bias voltage from the analog buffers than what is normally required to power the processor 355. The charge pump may supply a voltage in the range of 10 volts to 50 volts, and in some embodiments, both positive and negative supply voltages may be used.

It should be noted that the RF matching network shown in FIG. 2 is representative of many possible circuit topologies. Shown in FIG. 2 is a ladder network, but other topologies such as a T or Pi network may be used. The variable reactive elements (capacitors) are shown in shunt connections but that is not a restriction, as they may be used in series in other applications. Furthermore, three independent variable capacitances are shown in this RF matching network. However, fewer or more variable reactive elements may be used depending on the complexity needed to meet RF requirements.

In FIG. 3, the inductors for the RF matching network are shown to be included in the AIMM multichip module. In practice, this may not always be the case. If the module is extremely small, it may be more convenient to use external inductors for the matching network. External inductors may have a higher Q factor than smaller inductors that are able to be integrated on the module.

One of the important engineering specifications of the simplified AIMM control system is the dynamic range of input power over which it will operate. The lowest cost RF voltage detector is a simple diode detector, but it has a limited dynamic range of about 25 dB. Logarithmic amplifiers (that detect the signal envelope) have a much higher dynamic range of 50 dB to 60 dB, but their cost, complexity, chip area, and current drain is also much higher.

Figure 4:
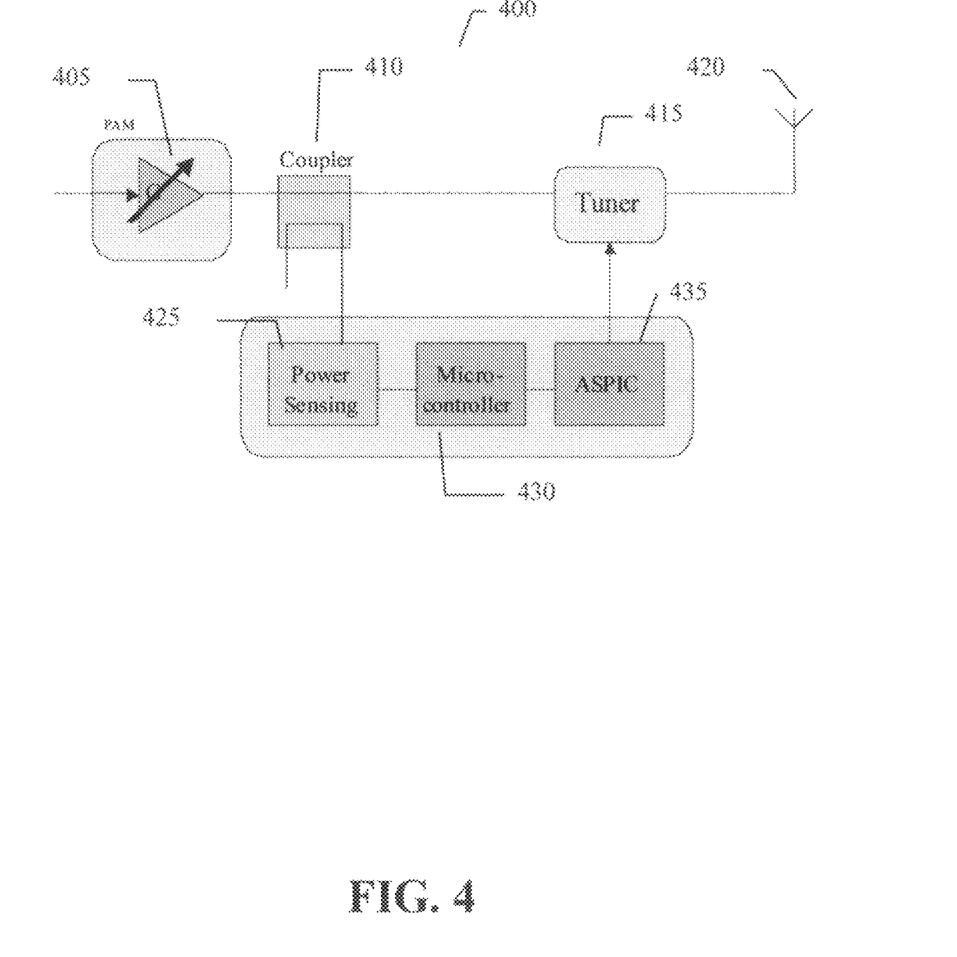
FIG. 4 is a illustrates an apparatus adapted to enable coupling for closed loop transmit power measurements of an embodiment of the present invention.

Looking now at FIG. 4 is a transmitter 400, that may benefit from the algorithm of the present invention, a tuner 415 capable of tuning antenna 420 associated with the transmitter 400, a power detector 425 adapted to acquire information about transmit power. Further, a power amplifier module (PAM) 405 may be coupled via a coupler 410 to a tuner 415 and further coupled to a power sensor 425, the power sensor 425 may provide power information to a micro-controller 430 connected to an application specific programmable integrated circuit (ASPIC) 435 which controls the tuner 415 for tuning the tunable antenna 420.

Figure 5:
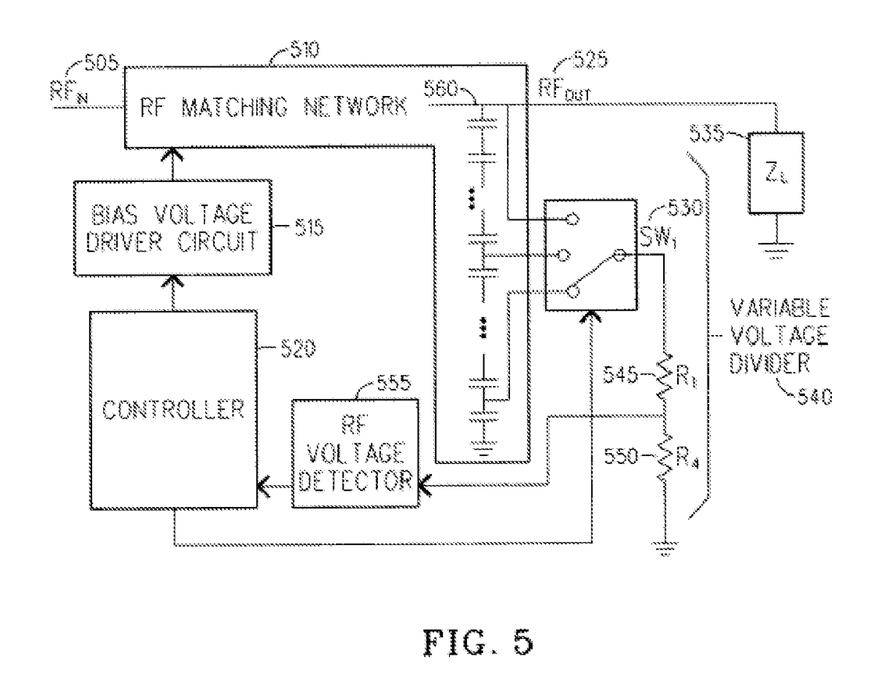
FIG. 5 shows a second embodiment of an enhanced dynamic range AIMM control system.

Equally important as enhancing the dynamic range is improving the output harmonics and IP3 of the module. The variable voltage divider 550 will allow the detector input port 505 to be more isolated at the higher power levels. This will improve linearity of the module for high signal levels.

Turning now to FIG. 5, generally at 500 are the functional blocks of a variable voltage divider 540, and the RF matching network 510 may be combined in hardware to some degree by understanding that the output node 525 of the matching network 510 may be connected to a shunt RF branch comprised of a series string of capacitors 560 and to impedance 535. An input node for $RF_{in}$ 505 may also be connected to the RF matching network 510. This series string 560 may be a RF voltage divider 540, and by selectively tapping into various circuit nodes along the string, one may obtain a variable output voltage divider 540. In an embodiment of the present invention, this is done with a digitally controlled RF switch 530. The switch 530 may be realized with FETs, MEMS, PIN diodes, or any other RF switch technology. Associated with variable voltage divider 540 is RF voltage detector 555 and controller 520, which is further connected to RF matching network 510 via bias voltage driver circuit 515.

As a practical matter, the resistance of R1 545 will need to be much higher (>10x) than the reactance of the string of series capacitors 560 between the tap point and ground. An alternative circuit to FIG. 5 would have the resistor $R_1$ 545 moved to the capacitor side of the switch $SW_1$ 530 and placed in each of the three lines going to the tap points. This will allow the resistors to be built on-chip with the tunable IC used in the matching network. Resister R4 may also be utilized at 550.

Some embodiments of the invention may be implemented, for example, using a machine-readable medium or article which may store an instruction or a set of instructions that, if executed by a machine, for example, by the system of FIG. 1 or FIG. 2, by controller 125 and 235 in communication with bias voltage driver circuit 120 and 230, by processor 355 of FIG. 3, or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.g., C, C++, Java, BASIC, Pascal, Fortran, Cobol, assembly language, machine code, or the like.

An embodiment of the present invention provides a machine-accessible medium that provides instructions, which when accessed, cause a machine to perform operations comprising connecting an RF matching network to at least one RF input port and at least one RF output port and including one or more voltage or current controlled variable reactive elements, tuning the RF matching network to optimize the RF matching network for RF transmissions bursts and limiting tuning steps to be between the transmission bursts. The machine-accessible medium of the present invention may further comprise the instructions causing the machine to perform operations further comprising connecting an RF matching network to at least one RF input port and at least one RF output port and including one or more voltage or current controlled variable reactive elements, tuning the RF matching network to optimize the RF matching network and limiting the tuning to avoid certain matching impedances at predetermined parameters.

Lastly, the machine-accessible medium of the present invention may further comprise the instructions causing the machine to perform operations further comprising connecting an RF matching network to at least one RF input port and at least one RF output port and including one or more voltage or current controlled variable reactive elements, tuning the RF matching network to optimize the RF matching network and storing in memory an optimal impedance match for each frequency band or each group of channels to enable an optimal tuning starting position for a given band or channel.

Some embodiments of the present invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors or controllers, or devices as are known in the art. Some embodiments of the invention may include buffers, registers, stacks, storage units and/or memory units, for temporary or long-term storage of data or in order to facilitate the operation of a specific embodiment.

Throughout the aforementioned description, BST may be used as a tunable dielectric material that may be used in a tunable dielectric capacitor of the present invention. However, the assignee of the present invention, Paratek Microwave, Inc. has developed and continues to develop tunable dielectric materials that may be utilized in embodiments of the present invention and thus the present invention is not limited to using BST material.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. An apparatus, comprising:
   an RF matching network coupled to at least one RF input port and at least one RF output port and including one or more voltage or current controlled variable reactive elements; and
   wherein said RF matching network is tuned to adapt said RF matching network to a change in impedance of a variable load impedance, and wherein said tuning is limited by a predetermined number of tuning steps that are taken within a transmit burst, wherein the predetermined number of tuning steps limit an undesirable effect on a transmitted signal in the transmit burst when the RF matching network is tuned according to an unconstrained number of tuning steps.

2. The apparatus of claim 1, wherein said tuning steps taken within transmit bursts are accomplished by using time delays corresponding to said transmission bursts.

3. The apparatus of claim 1, wherein said tuning is accomplished by varying the voltage or current to said voltage or current controlled variable reactive elements.

4. The apparatus of claim 3, wherein said variable reactive elements correspond to at least one of semiconductor varactors, micro-electro-mechanical systems (MEMS) varactors, MEMS switched reactance components, semiconductor switched reactance components, and variable dielectric capacitors.

5. An apparatus, comprising:
   an RF matching network coupled to at least one RF input port and at least one RF output port and including one or more voltage or current controlled variable reactive elements; and
   wherein said RF matching network is tuned to adapt said RF matching network to a change in impedance of a variable load impedance, and wherein said tuning is limited by a magnitude of each tuning step taken within a transmit burst, wherein limiting the magnitude of each tuning step limits an undesirable effect on a transmitted signal in the transmit burst when the RF matching network is tuned according to an unconstrained magnitude of each tuning step.

6. The apparatus of claim 5, wherein a portion of said tuning steps takes place between transmission bursts while the transmitter is inactive.

7. The apparatus of claim 5, wherein said variable reactive elements correspond to at least one of semiconductor varactors, micro-electro-mechanical systems (MEMS) varactors, MEMS switched reactance components, semiconductor switched reactance components, and variable dielectric capacitors.

8. An apparatus, comprising:
an RF matching network coupled to at least one RF input port and at least one RF output port and including one or more variable reactive elements; and
wherein said RF matching network is tuned to adapt said RF matching network to a change in impedance of a variable load impedance, wherein said tuning is limited by avoiding certain matching impedances of the variable load impedance, and wherein said avoidance of certain matching impedances limits an undesirable effect on a transmitted RF signal when the RF matching network is tuned to one of the avoided matching impedances.

9. The apparatus of claim 8, wherein said tuning is adapted to be placed in a default position when said apparatus is a cellular handset transmitter operating at full power or any predetermined power step.

10. An apparatus, comprising:
an RF matching network coupled to at least one RF input port and at least one RF output port and including one or more variable reactive elements;
wherein said RF matching network is tuned to adapt said RF matching network to a variable load impedance; and
wherein a plurality of tunable impedance values of the RF matching network are stored in a memory, wherein said memory is indexed according to at least one of a frequency band or a group of communication channels for tuning the RF matching network, wherein said tuning of the RF matching network for a given band or channel occurs during a transmit burst, and wherein said tuning is controlled in a manner that maintains signal integrity of a transmit signal in the transmit burst.

11. The apparatus of claim 10, wherein said memory is adapted to recall an initial operating impedance for said RF matching network.

12. The apparatus of claim 11, wherein said initial operating impedance is used as a starting point for an algorithm to control operations of said RF matching network.

13. A method, comprising tuning a matching network having variable reactive elements coupled to an antenna having a variable load impedance according to a subset of a total tuning range of the matching network while radiating an RF signal from said antenna, wherein the subset of the total tuning range of the matching network limits an undesirable effect on the RF signal when the matching network is tuned according to the total tuning range.

14. The method of claim 13, comprising using time delays for tuning said matching network while radiating said RF signal.

15. The method of claim 13, wherein said tuning is accomplished by varying a voltage or current applied to said variable reactive elements, and wherein the subset of the total tuning range corresponds to at least one of a limited number of impedance tuning steps of the matching network or a limited change in magnitude of impedance values between tuning steps.

16. A method, comprising adapting an impedance of a variable reactance network coupled to an antenna having a variable load impedance according to a subset of a total tuning range of the variable reactance network while transmitting an RF signal through the antenna, wherein the subset of the total tuning range limits an undesirable effect on the RF signal when the matching network is tuned according to the total tuning range.

17. The method of claim 16, wherein the subset of the total tuning range corresponds to at least one of a limited number of impedance tuning steps of the variable reactance network or a limited change in magnitude of impedance values between tuning steps.

18. The method of claim 16, wherein said variable reactive network comprises at least one of semiconductor varactors, micro-electro-mechanical systems (MEMS) varactors, MEMS switched reactance components, semiconductor switched reactance components, and variable dielectric capacitors.

19. A non-transitory machine-readable storage medium, comprising computer instructions to tune a variable reactance matching network coupled to a variable load antenna while avoiding one or more matching impedances of the antenna to limit an undesirable effect on a transmitted RF signal when the variable reactance matching network is tuned to one of the avoided matching impedances.

20. The storage medium of claim 19, comprising computer instructions to tune the variable reactance matching network while transmitting an RF signal through the antenna.

21. A non-transitory machine-readable storage medium, comprising computer instructions to tune a variable reactance network coupled to a variable load antenna according to a subset of a total tuning range of the variable reactance network while transmitting an RF signal through the antenna, wherein the subset of the total tuning range limits an undesirable effect on the RF signal when the variable reactance network is tuned according to the total tuning range.

22. The storage medium of claim 21, comprising computer instructions to:
recall one or more operating states of a mobile communication device from which the variable reactance network operates; and
adapt an impedance of the variable reactance network according to the recalled one or more operating states.

23. The storage medium of claim 22, wherein said operating states correspond to a mechanical state of a housing assembly of the mobile communication device.

24. The storage medium of claim 21, wherein the subset of the total tuning range corresponds to at least one of a limited number of impedance tuning steps of the variable reactance network or a limited change in magnitude of impedance values between tuning steps.

25. An apparatus, comprising:
a variable reactance network coupled to at least one RF input port and at least one RF output port and including one or more controllable variable reactive elements; and
wherein said variable reactance network is tuned to adapt said variable reactance network to a change in impedance of a variable load impedance, and wherein said tuning is limited by a magnitude of each tuning step that is taken between transmit bursts to limit an undesirable effect on transmitted signals during the transmit bursts caused by tuning the variable reactance network according to an unconstrained magnitude of each tuning step.

* * * * *